(12) United States Patent
Kempf

(10) Patent No.: US 6,368,435 B1
(45) Date of Patent: Apr. 9, 2002

(54) DEVICE AND METHOD FOR TRANSPORTING SEPARATE SUBSTRATES

(75) Inventor: Stefan Kempf, Alzenau (DE)

(73) Assignee: Singulus Technologies AG, Alzenau (DE)

( * ) Notice: Subject to any disclaimer, the term of this patent is extended or adjusted under 35 U.S.C. 154(b) by 0 days.

(21) Appl. No.: 09/424,657

(22) PCT Filed: May 26, 1998

(86) PCT No.: PCT/EP98/03094

§ 371 Date: Mar. 31, 2000

§ 102(e) Date: Mar. 31, 2000

(87) PCT Pub. No.: WO98/54754

PCT Pub. Date: Dec. 3, 1998

(30) Foreign Application Priority Data

May 28, 1997 (DE) .......................... 197 22 408

(51) Int. Cl.[7] .......................... B32B 31/06; B29C 65/80
(52) U.S. Cl. .................. 156/64; 156/275.7; 156/378; 156/379.8; 156/556; 156/578; 414/223.01; 414/758; 118/503
(58) Field of Search ................ 156/64, 275.7, 156/281, 295, 378, 379.8, 536, 556, 566, 571, 578; 414/223.01, 744.2, 744.3, 744.7, 758; 118/500, 503

(56) References Cited

U.S. PATENT DOCUMENTS

| | | | |
|---|---|---|---|
| 3,675,563 A | 7/1972 | Metreaud | |
| 4,969,790 A | 11/1990 | Petz et al. | |
| 5,612,068 A | 3/1997 | Kempf | |
| 5,938,891 A | * 8/1999 | Kashiwagi et al. | ......... 156/578 |
| 6,054,029 A | * 4/2000 | Kempf et al. | ......... 414/223.01 |

FOREIGN PATENT DOCUMENTS

| | | |
|---|---|---|
| DE | 42 35 677 | 4/1994 |
| DE | 196 06 763 | 4/1997 |
| DE | 196 06 764 | 4/1997 |

OTHER PUBLICATIONS

Leybold Systems, GmbH, LSC97–BR100R.02, "Speedline" brochure, replication by Leybold Systems, Feb. 1997.

* cited by examiner

Primary Examiner—Michael A Tolin
(74) Attorney, Agent, or Firm—Pillsbury Winthrop LLP

(57) ABSTRACT

A device and a method for separately transporting substances are provided. The device and method according to the invention can especially be used in connection with an unit for producing DVDs. Preferably, the device according to the invention has for each substrate an input station, a processing station and an output station, which stations are arranged on the circular arc at given distances α. Furthermore, grippers are provided, which are arranged on said circular arc at given distances α and can be simultaneously rotated around an axis through the center of said circle through an angle β. Each gripper transports one substrate to the processing and output stations in a rotational movement. It is the advantage of the invention that the mixing-up of substrates is avoided.

20 Claims, 2 Drawing Sheets

DEVICE AND METHOD FOR TRANSPORTING SEPARATE SUBSTRATES

Figure 1:
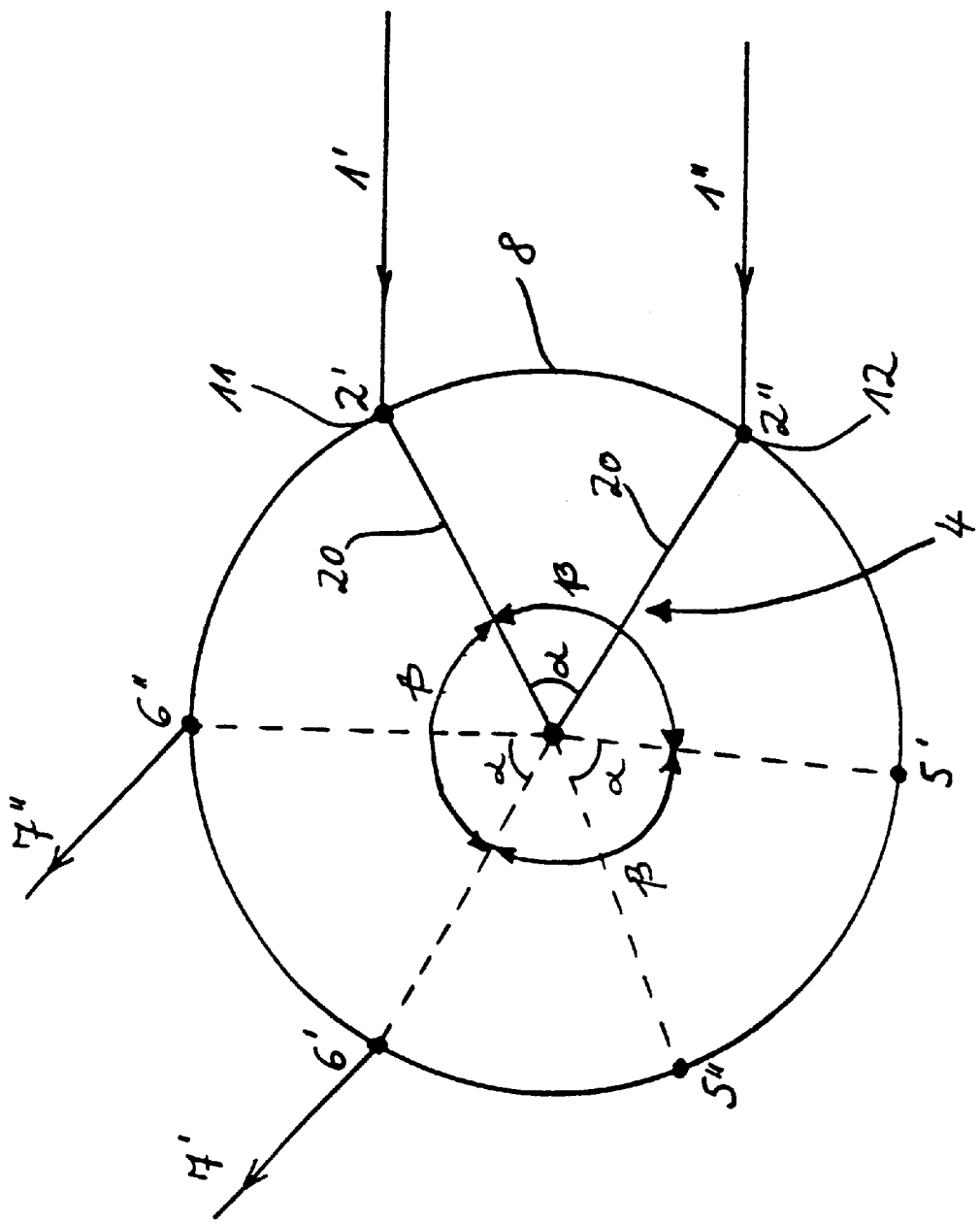

This application is the national phase of international application PCT /EP98/03094 filed May 26, 1998 which designated the U.S.

The invention relates to a device and a method for separately transporting substrates and can be used especially in the production of DVDs (digital versatile disks).

Especially in the production of DVDs it is of particular importance that two substrates, which are bonded to form a DVD, are kept apart during transport and are not mixed up.

In known transporting systems for the DVD process (Cube of the company Balzers, cf. DE-C2-42 35 677) the substrates for the DVD are supplied through one single lock station. In this case there is a risk that the different substrates are mixed up.

U.S. Pat. No. 4,969,790 discloses a device and a method for coating substrates in a vacuum chamber, wherein a rotatable substrate holder bears a plurality of substrate receivers adapted to transport substrates on a circular path from one lock station to an associated coating station and back to the same respective lock station.

Moreover, the prospectus Speedline, DVD-Speedline plus, Leybold Systems GmbH, 2/97 discloses a transporting system in which different substrates are transported by a rotational movement to different processing stations.

DE-C1-196 06 764 discloses a device for gripping, holding and/or transporting substrates. A substrate is transported by means of gripping elements from an input station to a plurality of processing stations arranged in a line or circle. A plurality of gripping arms can be adjusted in a horizontal and/or vertical direction. Some gripping elements can be adjusted together in a horizontal and/or vertical direction, and at least one gripping arm can be adjusted independently of the other gripping arms in at least one of the movement directions.

It is an object of the present invention to provide a device and a method for separately transporting substrates, wherein mixing-up of the substrates is reliably prevented.

The object is achieved with the features of the claims.

In achieving this object, the invention starts out from the following basic ideas.

Two input stations are arranged on a circular arc at a given angular distance α. Moreover, at least two processing stations, which are spaced from each other by the given angle α, can be provided on the arc of the circle. Grippers are provided on the same arc of the circle at the given distance α and can be simultaneously rotated around an axis through the center of said circle through an angle β. Two grippers simultaneously take one substrate each and transport the substrates to the processing stations, e.g. by rotating the gripping arrangement through 120°. Then the grippers can transport the different substrates to two output stations. The grippers can take up new substrates so that the transport step can be repeated. It is also possible to transport the substrates directly to the output stations thereby avoiding the processing stations, e.g. by changing the direction of rotation or, if the direction of rotation is maintained, by a rotation through 240°. Preferably, the grippers make a pendulum movement. Two grippers transport the substrates from the input stations to the processing stations and two grippers from the processing stations to the output stations in a reciprocating movement.

The advantages of the present invention reside in that a mixing-up of the substrates is avoided.

Figure 2:
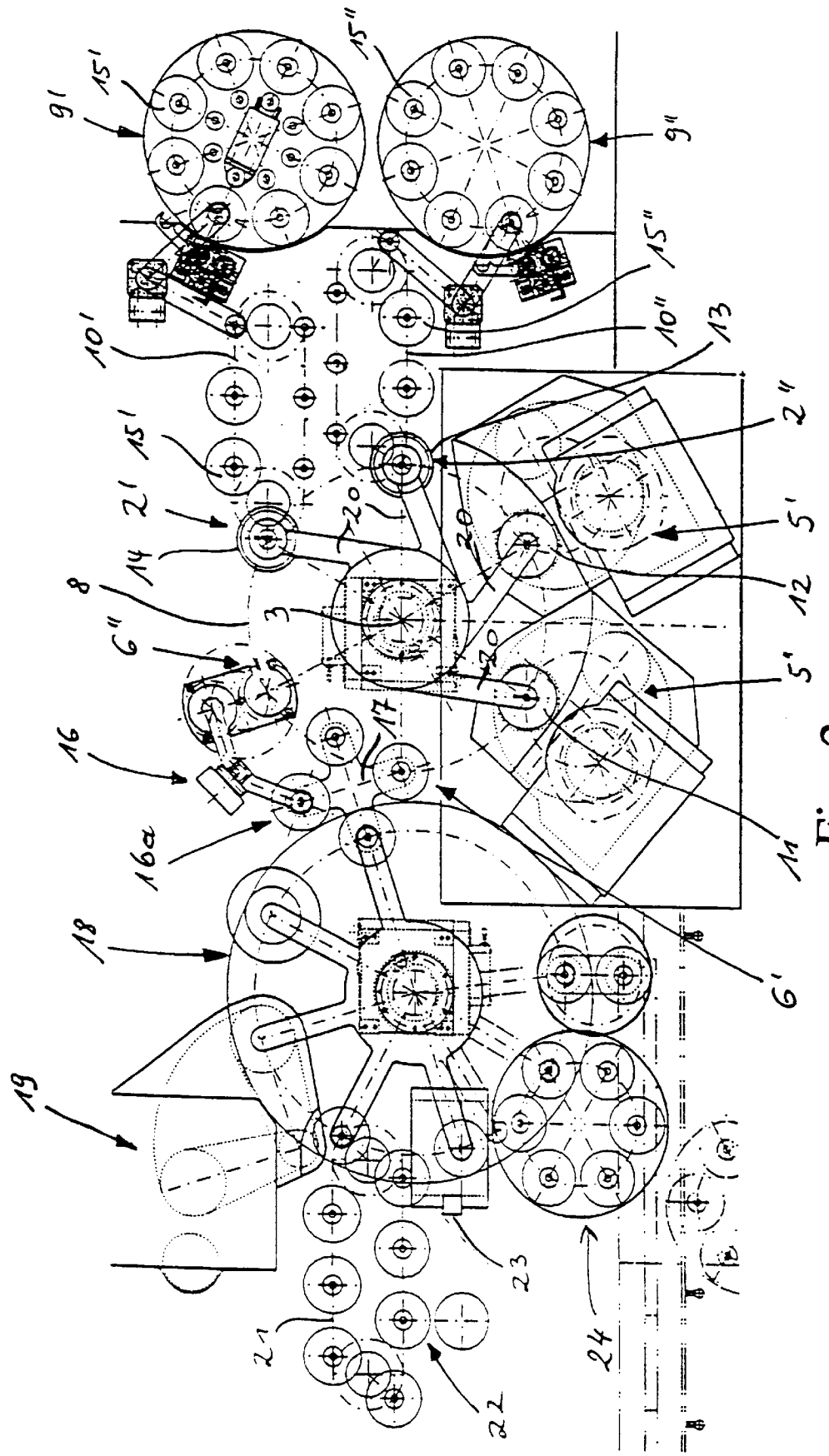

In the following, the invention is explained in more detail on the basis of the drawings in which FIG. 1 is a basic drawing of the device of the present invention, FIG. 2 is a top view of an embodiment of the present invention in connection with an arrangement for producing DVDs.

FIG. 1 shows a top view of the basic construction of the device of the present invention. Two separate transport paths 1', 7' and 1", 7" are connected with each other by a transporting means 4. The device comprises two input stations 2', 2", two processing stations 5', 5" and two output stations 6', 6". The transporting means 4 comprises at least two grippers 11, 12 which are rotatable around a rotational axis 3 and which are arranged on a circular arc 8 at a given angular distance α by means of arms 20. Between the two input stations 2', 2", the two processing stations 5', 5" and the two output stations 6', 6", there is the same given angular distance α. The substrates 1' and 1" taken by the respective grippers 11 and 12 at the respective input stations 2' and 2" are transported by a rotational movement through an angle β to the respective processing stations 5' and 5" and/or the respective output stations 6' and 6". The rotational angle β depends on the distance of the different stations. However, it is preferably larger than the angle α between two equal stations. Thus, even more than the three station pairs as shown in FIG. 1 may be arranged on a single circular arc.

FIG. 2 shows an embodiment of the invention in connection with an arrangement for producing DVDs. Substrates 15' and 15" are transported from respective magazines or spindles 9' and 9" via respective transport paths 10' and 10" to the respective input stations 2' and 2". The input stations are arranged on the circular arc 8 at a distance of preferably 60°. Moreover, two processing stations 5' and 5" and two output stations 6' and 6", which are spaced from each other and from the input stations by 60°, are arranged on the same circle. A transporting means 4 which can be rotated around an axis 3 of the circular arc 8 comprises grippers 11, 12, 13 and 14 for transporting the substrates 15' and 15" on the circle 8. In FIG. 2 the grippers 11 and 12 take over the substrates 15" and 15', respectively, in the respective processing stations 5" and 5', and the grippers 14 and 13 take over the substrates 15' and 15", respectively, in the respective input stations 2' and 2". Thus, it is guaranteed that substrates 15' from the transport path 10' can only be transported to the processing station 5' and substrates 15" from the transport path 10" only to the processing station 5". From the processing stations 5" and 5', the respective grippers 11 and 12 then transport the substrates to the respective output stations 6" and 6'. The grippers 11 and 12, which became free, are then rotated back to the respective processing stations 5" and 5' and, at the same time, the grippers 13 and 14 are rotated back to the respective input stations 2" and 2'. In this connection, the grippers carry out a reciprocating (pendulum) movement. In this way, grippers being optimally adapted to the respective situation can be used. However, it is also possible to standardize the stations and to use a standardized type of gripper. Then, the grippers can move along the circle and, for example, three gripper pairs can be used.

In the arrangement according to FIG. 2 the processing stations 5' and 5" are for example cathode sputtering units in which the substrates 15' and 15" are coated. The grippers 13 and 14 supply the respective substrates 15" and 15' to the lock stations (not shown) of the corresponding cathode sputtering units in which the substrates 15' are coated with a fully reflecting layer of e.g. aluminum and the substrates 15" with a semi-transparent layer, e.g. gold. After a cyclical course through the cathode sputtering unit, the substrates 15" and 15' are again taken up by the respective grippers 11 and 12 and transported to the output stations 6" and 6'. A turning device 16 is arranged behind the output station 6", and a rotary table 17 is arranged behind the output station 6'. The rotary table 17 transports the substrate 15' into the area 16a of the turning device 16 which places the turned substrate 15" onto the substrate 15'. Then the two substrates are bonded. By a further transporting means 18, the bonded substrates 15 (consisting of substrates 15' and 15") are transported into a drying means 19 for curing the bonding layer (e.g. by UV radiation), then by a transporting means 21 to a turning station 22 and a test station (scanning means) 23 and finally to the output station 24.

In the turning station 22 the bonded substrate 15 is turned upside down so that the half 15" lies on the bottom. Then the substrate is transported to the test station 23. The turning station 22 is provided to allow, depending on the DVD type, scanning through the substrate 15" and the transparent semi-transparent layer, e.g. gold layer, from the bottom if, as shown in the example of FIG. 2, the DVD comprises on its top a substrate 15" having a gold layer, for drying the bond layer in the drying means 19 from the top through the semi-transparent gold layer with low energy and thus time requirements. The turning station 22 is not used if the upper substrate 15" is not coated, as it is the case in other DVDs (type DVD5), and if the lower substrate 15' is coated with aluminum. In this case the DVD is already in the position required for scanning in the test station. The turning station 22 which can be used optionally thus increases flexibility and usability of an unit for producing different DVDs, e.g. DVD9 or DVD5.

Thus, the use of a turning station which can be used optionally is also per se in general an essential inventive feature in the production of DVDs.

Instead of being connected with the magazines (spindles) 9' and 9", the respective transport paths 10' and 10" can also be connected directly with an injection molding machine for producing the respective substrates 15' and 15".

If no processing steps are required in the processing stations 5' and 5", e.g. in case the two substrates 15' and 15" are produced and coated off-line and are then stored temporarily in the two spindles 9' and 9", respectively, the substrates 15' and 15" can possibly be transported directly to the respective output stations 6' and 6" by changing the direction of rotation.

By means of the device according to the present invention the substrates can easily be transported on two separate transport paths without the risk of mixing them up, wherein for retrofitting the unit, the processing stations 5' and 5" can be easily incorporated later, if required.

It is also possible to combine the transporting means 4 together with the bonding means 16a, the transporting means 18, the drying station 19, the turning station 22 and the test station 23 with any desired number of other upstream-located means (e.g. sputtering unit, injection molding unit) and processing stations in accordance with the unit construction principle.

What is claimed is:

1. A device for producing a substrate composite consisting of two substrates bonded together with an intermediate bond layer; said device comprising:
    (a) first and second input stations (2", 2', respectively) arranged on a circular arc (8), said input stations being spaced apart by an angular distance α and each respectively supplying a respective one of a first and a second substrate (15", 15') for a first and a second substrate composite half,
    (b) at least first and second processing stations (5", 5') arranged on the circular arc (8), said processing stations being spaced apart by the angular distance α,
    (c) first and second output stations (6", 6', respectively) arranged on the circular arc (8), said output stations being spaced apart by the angular distance α, for receiving the first and the second substrates, respectively, after processing, wherein the first output station (6") comprises a device for turning the first substrate and placing it onto the second substrate,
    (d) a first transporting means (4) for transporting the first and second substrates on the circular arc (8) and comprising at least two grippers (11 and 12) which can be rotated on the circular arc through an angle β, wherein each of the grippers (11 and 12) transports a respective one of the first and second substrates from a respective input station (2" and 2') to a respective processing station (5" and 5') and to a respective output station (6" and 6'),
    (e) a bonding station for bonding the first and second substrates with a bond layer disposed intermediate the first and second substrates to form a substrate composite,
    (f) a drying station (19) for curing the bond layer,
    (g) a turning station (22) for turning the substrate composite,
    (h) a test station (23) for testing the substrate composite,
    (i) an output station (24) for the substrate composite, and
    (j) a second transporting means (18) for transporting the substrate composite between the stations defined in clauses (e) to (i).

2. The device according to claim 1, wherein the processing stations (5" and 5') are cathode sputtering units.

3. The device according to claim 1, wherein the second output station (6') comprises a rotary table which transports the second substrate to the turning device of the first output station (6").

4. The device according to claim 1, further comprising a third transporting means (21) for transporting the substrate composite between the drying station and the turning station.

5. The device according to claim 1, wherein the first and the second input stations (2" and 2', respectively) are connected with magazines or spindles for the substrates or with an injection molding unit for the substrates via a transport path.

6. The device according to claim 1, wherein the rotational angle β of the grippers of the first transporting means (4) is larger than the angular distance α.

7. The device according to claim 6, wherein the angular distance α is 60°.

8. The device according to claim 7, wherein each input station is spaced from a respective processing station and a respective output station by the angle β, which is 120°.

9. The device according to claim 1, wherein the first transporting means (4) comprises first, second, third and fourth grippers (11, 12, 13, 14) arranged at an angular distance from one another, wherein between the first and the second grippers (11 and 12, respectively) and between the third and the fourth grippers (13 and 14, respectively) there is the angular distance α, and between the first and the third grippers (11 and 13, respectively) and between the second and the fourth grippers (12 and 14, respectively) there is the angular distance β.

10. The device according to claim 9, wherein the substrate composite is a DVD and the first and the second substrates (15', 15") are the halves of a DVD.

11. The device according to claim 1, wherein the first transporting means (4) comprises six grippers each being arranged at an angular distance of 60° from one another.

12. The device according to claim 1, wherein the substrate composite is a DVD and the first and the second substrates (15', 15") are the halves of a DVD.

13. A method for producing a substrate composite using the device according to claim 1; the method comprising:

(a) transporting a first and a second substrate (15", 15') for a first and a second substrate composite half to the first and the second input stations (2" and 2', respectively), respectively, (b) transporting the first and the second substrates by means of the respective grippers (11 and 12) to the first and the second processing stations (5" and 5'), respectively, (c) selectively coating the first and the second substrates, (d) transporting the first substrate and the second substrate by means of the respective grippers (11 and 12) to the first and the second output stations (6" and 6', respectively), respectively, (e) turning the first substrate (15"), (f) transporting the second substrate (15') beneath the first substrate (15"), (g) bonding the first and the second substrates with a bond layer disposed intermediate the first and second substrates to form a substrate composite, (h) transporting the substrate composite to the drying station (19), (i) curing the bond layer, (j) transporting the substrate composite to the turning station (22) for turning the substrate composite, (k) transporting the substrate composite to the test station (23), (l) testing the substrate composite, and (m) transporting the substrate composite to the output station (24).

14. The method according to claim 13 further comprising turning the substrate composite after (j) and before (k).

15. The method according to claim 13 wherein operation of the turning station (22) in (j) further comprises selectively turning the substrate composite only when a lower half of an arriving substrate composite is not coated.

16. The method according to claim 15, wherein said testing the substrate composite in (l) comprises scanning the substrate composite from the bottom.

17. A method of using the device according to claim 9 for producing a substrate composite, wherein the processing stations are cathode sputtering units, the method comprising:

(a) transporting first and second substrates (15" and 15') on transport paths (10" and 10') to the respective input stations (2" and 2'), (b) transporting the first and the second substrates (15" and 15', respectively) by means of the third and the forth grippers (13 and 14, respectively) to respective cathode sputtering units (5" and 5') by rotating the transporting means through 120°, (c) selectively coating the first substrate (15") in the first cathode sputtering unit (5") and selectively coating the second substrate (15') in the second cathode sputtering unit (5'), (d) transporting the two substrates (15" and 15') by means of the first and second grippers (11 and 12, respectively) to the first output station (6") being arranged upstream of a turning device (16), and to the second output station (6') being arranged on a rotary table (17), respectively, (e) turning the first substrate (15") in the turning device (16) and placing the second substrate (15') onto the first substrate (15"), (f) bonding the substrates (15' and 15"), with a bond layer disposed between the substrates (15' and 15"), in the bonding station to form the substrate composite, (g) transporting the substrate composite by means of the second transporting means (18) to the drying station (19), (h) drying the substrate composite to cure the bond layer, and (i) transporting the substrate composite to the test station (23) and to the output station (24).

18. The method according to claim 17, wherein between (h) and (i) the substrate composite is turned in a turning station (22) so that the second substrate (15') lies on the bottom and it is thus possible to scan the substrate composite from the bottom in the test station (23).

19. The method according to claim 17, wherein the grippers (11, 12, 13, 14) circulate on the circular arc (8) in one direction and each pair of grippers (11, 12 and 13, 14) serves all stations (2', 2"; 5', 5"; 6', 6").

20. The method according to claim 17, wherein the substrate composite is a DVD and the first and second substrates are the halves of a DVD.

* * * * *